United States Patent [19]
Grebinski

[11] Patent Number: 4,778,536
[45] Date of Patent: Oct. 18, 1988

[54] SULFUR TRIOXIDE VAPOR PHASE STRIPPING

[75] Inventor: Thomas J. Grebinski, Menlo Park, both of Calif.

[73] Assignee: Purusar Corporation, Sunnyvale, Calif.

[21] Appl. No.: 95,403

[22] Filed: Sep. 10, 1987

Related U.S. Application Data

[63] Continuation-in-part of Ser. No. 745,241, Jun. 13, 1985, Pat. No. 4,695,327.

[51] Int. Cl.$^4$ .............................................. B08B 3/08
[52] U.S. Cl. ............................. 134/36; 134/11; 134/41; 437/229
[58] Field of Search ................. 134/11, 28, 30, 31, 134/36, 37, 41; 156/659.1; 252/79.2; 437/229, 236, 238

[56] References Cited

U.S. PATENT DOCUMENTS

| | | | |
|---|---|---|---|
| 3,727,620 | 4/1973 | Orr | 134/95 |
| 3,769,992 | 11/1973 | Wallestad | 134/153 |
| 4,253,888 | 3/1981 | Kikuchi | 437/35 |
| 4,264,374 | 4/1981 | Beyer et al. | 134/30 |
| 4,303,454 | 12/1981 | Petterson et al. | 134/11 |
| 4,519,846 | 5/1985 | Aigo | 134/30 |
| 4,695,327 | 9/1987 | Grebinski | 134/11 |

Primary Examiner—Patrick P. Garvin
Assistant Examiner—George R. Fourson
Attorney, Agent, or Firm—Fliesler, Dubb, Meyer & Lovejoy

[57] ABSTRACT

A method is set forth of treating the surface of an object such as a semiconductor wafer to remove impurities. In particular, the method serves to strip resist in a short period of time, of the order of 30 seconds. The object is positioned with the surface exposed within a treating chamber. Water vapor is contacted with sulfur trioxide vapor adjacent the surface to provide a hot mixture comprising sulfur trioxide, water and sulfuric acid. The hot mixture is impinged onto the surface. The contacting is immediately prior to and/or simultaneous with the impinging. Photoresist is quickly and efficiently removed in accordance with this process. Energy requirements are relatively low since the components are easily vaporized.

9 Claims, 1 Drawing Sheet

4,778,536

SULFUR TRIOXIDE VAPOR PHASE STRIPPING

CROSS-REFERENCE

This application is a continuation-in-part of co-pending application Ser. No. 745,241, filed June 13, 1985 now U.S. Pat. No. 4,695,327.

TECHNICAL FIELD

The invention is concerned with a method of chemically treating a surface of an object to remove impurities. The method is particularly useful for stripping resist from the surfaces of semiconductor wafers.

BACKGROUND ART

In the processing of wafers used in the manufacture of integrated circuits and the like, it is necessary in various processing steps to accomplish etching of certain areas of the wafer, to remove photoresist coating which may be applied to the wafer, and to otherwise clean the wafer. Prior art resist stripper processes are generally relatively slow, taking 30 to 60 minutes to remove the resist.

An apparatus which is directed toward these processing steps is disclosed in U.S. Pat. No. 3,990,462, issued to Elftmann, et al. As disclosed therein, wafers are disposed in cassettes which are in turn mounted on a rotary turntable. A central post defines a plurality of pairs of ports, each port being positioned to direct fluid therefrom onto an adjacent wafer as that wafer passes the port due to the rotary motion of the turntable. As disclosed in that patent, one port of each pair carries acid or water, while the other port carried gas, such as gaseous nitrogen, or air. Each pair of ports is positioned so that, with continuous fluid flow from that pair, an atomized fog-spray is provided to the wafer.

It will be understood that processing of such wafers must be done in an extremely even manner so that all parts of the wafer are processed properly and uniformly. This has been a problem in the type of apparatus disclosed in the above-cited patent. Furthermore, the processing of a wafer in such a system is relatively slow.

In U.S. Pat. No. 3,970,249 to Singer, secondary streams are alternatively applied to a stream of atomized particles by applying those particles to a substrate. The system thereof, however, is not applicable to processing semiconductor wafers, in particular the removal of material from a semiconductor wafer through etching, stripping or cleaning.

It is also known to utilize a semiconductor wafer processing apparatus which comprises a body defining first and second adjacent ports through which fluid may flow from the body, the ports being positioned so that fluid flow from the first port influences fluid flow from the second port, means for varying fluid flow from the first port, and means for supporting the wafer such that at least a portion of the fluid flow moves generally across a major surface of a so-supported wafer.

Of more general interest in this area are U.S. Pat. No. 3,769,992, to Wallestad and U.S. Pat. No. 3,727,620 to Orr.

Another process for cleaning semiconductor wafers is to contact them with a liquid solvent of the desired composition. The composition may be stirred or otherwise caused to flow across or against the surfaces of the wafers to provide somewhat of a washing action. Combinations of sulfuric acid with hydrogen peroxide, which produce and include a small quantity of $H_2SO_5$, have some degree of effectiveness in stripping off resist but sulfuric acid alone is much less effective; indeed, it is so ineffective that, as a practical matter, it is not useful for this purpose and is not recognized by the art as being useful for this purpose. Resist materials have also been removed by one or more of halogenated hydrocarbons, such as methylene chloride, sulfides such as dimethylsulfide, amines and their derivatives such as dimethylformamide, N-methyl-2-pyrrolidinone, glycol ethers such as ethylene glycol monoethyl ether, ethynol and the acetates thereof, ketones such as methyl ethyl ketone and acetone and materials such as isopropyl alcohol, ammonium persulfate and mixtures of caustic and phenol derivatives as well as by various other materials.

Other methods of stripping resist include use of $O_2$ plasmas, U.V./ozone, plus combinations, e.g., two operative processes. First a plasma step and then liquid acid dip is the most common practice and the only way to do complete resist stripping job.

There are several drawbacks with the use of the aforementioned photoresist material removing compositions. One of the major disadvantages with the aforementioned methods of stripping photoresist is that they do not adequately remove deep UV baked, plasma hardened or implant hardened photoresist, or they leave behind traces of resist film and non-dissoled yield limiting contaminants originating from the liquid stripping compositions. The other disadvantages are undesirable flammability, volatility, odor or toxicity, drainage of large quantities of possible dangerous chemicals in city sewer systems and attack of underlying metal films. Additionally, such strippers are not effective against resist materials that are subject to a severe post baking operation thereby limiting their usefulness. A disadvantage in instances where plasmas or U.V./ozone is used is that particulates are formed which must be liquid acid stripped. The plasma systems of choice are very complex (involving complicated vacuum systems and automation) and are als quite expensive.

A rapid and highly effective method of cleaning wafers, including particularly cleaning even off hard UV baked and other hard to remove resists would be highly desirable. Further, it is desirable that such a process be carried out with relatively low power requirements and using readily available and low cost chemicals.

DISCLOSURE OF INVENTION

In accordance with the present invention, a method is set forth of treating a surface of an object to remove impurities. The treating method comprises positioning the object, with the surface exposed, within a treating chamber; contacting water vapor with sulfur trioxide vapor adjacent said surface to provide a hot mixture comprising sulfur trioxide, water and sulfuric acid, and impinging said hot mixture on said surface, said contacting being immediately prior to and/or simultaneous with said impinging.

When one operates in accordance with the present invention, organic materials, including resists (photo-, electron-beam, etc.), and including hard UV baked and other particularly removal resistant resists, are extremely efficiently and quickly (generally in less than about 10 minutes, e.g., in about 30 seconds) stripped from wafers without the necessity for including hydrogen peroxide as part of the stripping composition. And, the necessary components, sulfur trioxide and water, can be readily vaporized and flowed into contact with one another adjacent the surface of the wafer whereby operation is both reasonably easy and inexpensive.

BRIEF DESCRIPTION OF THE DRAWINGS

The invention will be better understood by reference to the figures of the drawings wherein like numbers denote like parts throughout and wherein.

BEST MODE FOR CARRYING OUT THE INVENTION

The present invention is based upon the unexpected observation that if one impinges onto the surface of a wafer having a resist material thereon a hot mixture comprising sulfur trioxide, water and sulfuric acid, which mixture is made by contacting water vapor with sulfur trioxide vapor adjacent the surface of the wafer upon which it is being impinged, the resist material is stripped completely away, even if the resist material is deep UV baked resist.

Figure 1:
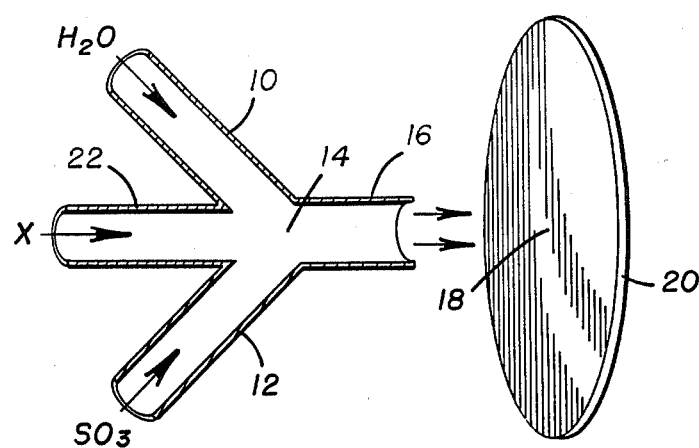
FIG. 1 illustrates, schematically, an embodiment in accordance with the present invention.

Referring to FIG. 1 an embodiment of the method of the present invention is illustrated wherein water vapor is flowed under pressure into a tube 10 and sulfur trioxide vapor is flowed under pressure into a tube 12. The two mix together in a chamber 14 defined by a tube 16 from which the combined vapors go forward and impinge upon a surface 18 of a semiconductor wafer 20. If desired an additional material, for example hydrogen peroxide or some other oxidizer such as oxygen, can be admixed with the water and sulfur trioxide in the chamber 14. The hydrogen peroxide oxidizer or an inert carrier gas (e.g., nitrogen) or oxygen can be added via an auxiliary tube 22 to the tube 16. An inert carrier gas can also or alternatively be introduced along with the water vapor and/or the sulfur trioxide vapor.

Figure 2:
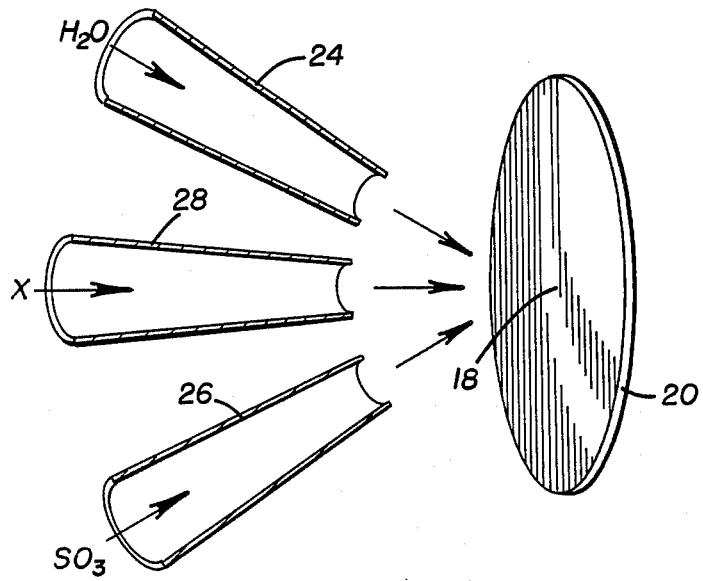
FIG. 2 illustrates, schematically, an alternate embodiment in accordance with the present invention.

FIG. 2 illustrates a slightly different embodiment of the present invention wherein the water, sulfur trioxide, and other components, for example hydrogen peroxide, when present, proceed from respective individual tubes 24, 26 and 28, respectively onto the surface 18 of the wafer 20. Alternatively, the tubes 24 and 26 may both be used to introduce water vapor, e.g., along with an inert gas (or oxygen), and the tube 28 can be used to introduce the sulfur trioxide.

It is preferable if the water-sulfur trioxide mixture, when it impinges upon the surface 18 of the wafer 20, is still hot. Thus, it is preferred that the water and sulfur trioxide be mixed relatively close to the surface 18, or even at the surface 18. Furthermore, it is important that the mixture impinge upon the surface 18 since this provides needed scrubbing action.

When water and sulfur trioxide vapor comes together the result is the formation of sulfuric acid whereby the mixture of water and sulfur trioxide also includes sulfuric acid. Furthermore, the entire reaction is quite exothermic whereby any resist on the surface 18 is readily removed. Note that it is important that the hot mixture which impinges upon the surface 18 of the wafer 20 includes sulfur trioxide and water as well as sulfuric acid. The water and sulfur trioxide can continue to react even as they impinge upon the surface 18 whereby heat is generated in situ on the surface 18, just where such heat is most needed to strip off hard baked photoresist. Furthermore, it is believed that the chemical reaction of sulfur trioxide is important in stripping off the photoresist as opposed to the action of hot sulfuric acid because of the intense process going on between $SO_3(v)$ and $H_2O(v)$ as sulfuric acid is formed.

The water vapor which is introduced via the tube 10 is superheated to a temperature above 130° C., varying the range from about 100° C. to about 200° C., although higher temperatures can be used as well. The sulfur trioxide vapor is at a temperature above its boiling point of approximately 45° C., and will generally be in the range from 45° C. to about 125° C., although higher temperatures can also be used.

While the sulfur trioxide vapor and the water vapor introduced may be at relatively low temperatures, for example about 45° C. for the sulfur trioxide vapor and just a bit above 100° C. for the water vapor, the resulting temperature in the chamber adjacent the surface 18 of the wafer 10 is quite high, of the order of 150° C. to 350° C., and generally above about 250° C. The temperature elsewhere in the chamber 14 can be lower.

It is important to note that the sulfur trioxide and the water vapor can be readily vaporized due to their relatively low boiling points whereas vaporization of sulfuric acid, should it be attempted, would require heating the compounds to a temperature of above about 330° C., the boiling point of sulfuric acid. Thus, the present process is relatively low in energy consumption.

A variety of mass flows can be used depending on the orifice size to provide the proper mass velocity impinging on the surface 18 of the wafer 20. For example, mass flows from 10 or less to hundreds of liters of gas per minute can be used.

It is generally preferable in accordance with the present invention to operate at reasonably high temperatures when the sulfur trioxide, water, sulfuric acid mixture is impinged upon the surface 18 of the wafer 20. Thus, it is preferred that the temperature be above about 150° C., and more preferably above about 250° C. Note that the temperature referred to is not the overall temperature of the chamber 14 in which the stripping operation is being carried out, but rather the temperature of the mixture at the surface 18 of the wafer 20. Note also that the impinging of the mixture onto the surface 18 of the wafer 20 need not be at an extremely high velocity. However, it is preferred that the impinging be at sufficient velocity to provide a scrubbing action to dislodge any particulate materials as well as to aid in speeding up the removal of the resist.

The entire process is generally carried out in an appropriate chamber and the resulting sulfuric acid is recoverable utilizing a tap at the bottom of the chamber.

Hydrogen peroxide or another added cleaning agent, indicated by "X" in FIGS. 1 and 2, may also be impinged upon the surface 18 of the wafer 20. If hydrogen peroxide is utilized this serves to form $H_2SO_5$ by the interaction of the sulfuric acid which is formed with the hydrogen peroxide. However, it is not yet necessary to include hydrogen peroxide in order to obtain complete removal of hard baked resist coatings.

The present process removes not only photoresist coatings and other organic contaminants, but also alkali metals and alkaline earth metals from the surface 18 of the wafer 20.

Following the above set forth process the wafers are generally bulk rinsed with high purity and high pressure distilled water vapor by simply discontinuing flow through the tube 12, and the tube 22 if that is being used, and continuing flow through the tube 10. Thereafter, the wafer can be dried, for example with hot ionized nitrogen gas.

The invention will be better understood by reference to the following illustrative example.

EXAMPLE

Water and sulfur trioxide vapor, the water vapor at a temperature of about 105° C. and the sulfur trioxide vapor at a temperature of 70° C. were flowed through respective tubes 10 and 12 and mixed in chamber 14 and then the resulting hot mixture flowed through tube 16 and impinged upon the surface 18 of a silicon semiconductor wafer 20. A thermometer was in the reaction chamber, which was sealed, near the stream exiting the tube 16 but not in that stream. The surface 18 of the wafer 20 had a hard baked resist layer on it which had been hard baked by heating it to 190° C. for 30 minutes. The combined water, sulfur trioxide, sulfuric acid stream was impinged on the surface 18 of the wafer 20 for approximately 30 seconds, at the end of which time flow was ceased other than flow of the water vapor which continued for an additional 300 seconds. The wafer on removal from the reaction chamber was examined and found to be completely free of photoresist. The complete reaction conditions were as follows: mass flow ratio of sulfur trioxide to water=1.5, mass flow rate of 20 to 40 liters of gas per minute, pressure of water vapor=10 psig, pressure of sulfur trioxide vapor=6 to 7 psig. The thermometer during the 30 seconds went from an initial temperature of 60° C. to a final temperature of 185° C.

Industrial Applicability

The present invention provides a method for stripping resists and other materials from wafer surfaces 18. Reaction is extremely rapid, taking only a few seconds as compared to 30 to 60 minutes with state of the art plasma and wet stripping processes. The chemicals utilized are relatively easy to handle and the waste product is relatively eaily disposed of.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

I claim:

1. A method of treating a surface of an object to remove impurities, comprising:
    positioning the object, with the surface to be cleaned exposed, within a treating chamber;
    contacting water with sulfur trioxide vapor adjacent said surface to provide a hot mixture comprising sulfur trioxide, water and sulfuric acid; and
    impinging said hot mixture on said surface at a sufficient velocity to provide a scrubbing action to dislodge any particulate materials, said contacting being immediately prior to and/or simultaneously with said impinging.

2. A method as set forth in claim 1, wherein said hot mixture is at a temperature of above about 150° C.

3. A method as set forth in claim 2, wherein said object is a semiconductor wafer and said impurities comprise resist.

4. A method as set forth in claim 3, further including:
    admixing an additional cleaning component with said mixture.

5. A method as set forth in claim 3, wherein said hot mixture is at a temperature above about 150° C.

6. A method as set forth in claim 5, wherein said contacting is for a time of less than about 10 minutes.

7. A method as set forth in clim 3, wherein said additional cleaning component comprises hydrogen peroxide.

8. A method as set forth in claim 2, wherein said water vapor is at a temperature above about 100° C. and said sulfur trioxide vapor is at a temperature above about 45° C.

9. A method as set forth in claim 5, wherein said water vapor is at a temperature above about 100° C. and said sulfur trioxide vapor is at a temperature above about 45° C.

* * * * *